US012616036B2

(12) United States Patent
Wada

(10) Patent No.: US 12,616,036 B2
(45) Date of Patent: Apr. 28, 2026

(54) INTERCONNECT SUBSTRATE, METHOD OF MAKING THE SAME, AND METHOD OF IDENTIFYING INTERCONNECT SUBSTRATE

(71) Applicant: SHINKO ELECTRIC INDUSTRIES CO., LTD., Nagano (JP)

(72) Inventor: Kazuki Wada, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 423 days.

(21) Appl. No.: 18/341,119

(22) Filed: Jun. 26, 2023

(65) Prior Publication Data

US 2024/0006334 A1      Jan. 4, 2024

(30) Foreign Application Priority Data

Jun. 30, 2022      (JP) ................................. 2022-106602

(51) Int. Cl.
| | |
|---|---|
| *H10W 46/00* | (2026.01) |
| *G06T 7/00* | (2017.01) |
| *H10W 70/05* | (2026.01) |
| *H10W 70/63* | (2026.01) |
| *H10W 70/69* | (2026.01) |

(52) U.S. Cl.
CPC ............. *H10W 46/00* (2026.01); *G06T 7/001* (2013.01); *H10W 70/095* (2026.01); *H10W 70/69* (2026.01); *G06T 2207/30148* (2013.01); *H10W 46/401* (2026.01); *H10W 70/635* (2026.01)

(58) Field of Classification Search
CPC ......... G06T 2207/30148; G06T 7/001; H10W 46/00; H10W 46/401; H10W 70/095; H10W 70/635; H10W 70/685; H10W 70/69
See application file for complete search history.

(56) References Cited

U.S. PATENT DOCUMENTS

| | | | | |
|---|---|---|---|---|
| 10,062,012 | B1* | 8/2018 | Park | G06T 7/001 |
| 10,593,604 | B1* | 3/2020 | Lam | H10P 74/207 |
| 11,119,060 | B2* | 9/2021 | Saraswatula | G06T 7/0006 |
| 2012/0076394 | A1* | 3/2012 | Nikaido | G06T 5/92 |
| | | | | 382/145 |
| 2013/0043067 | A1* | 2/2013 | Hayashi | B32B 3/266 |
| | | | | 977/932 |
| 2014/0133736 | A1* | 5/2014 | Tien | G01N 21/9501 |
| | | | | 382/149 |
| 2014/0303921 | A1* | 10/2014 | Jayaraman | H10P 74/203 |
| | | | | 702/82 |

(Continued)

FOREIGN PATENT DOCUMENTS

JP          2012-039028          2/2012

*Primary Examiner* — Timothy J Thompson
*Assistant Examiner* — Rhadames Alonzo Miller
(74) *Attorney, Agent, or Firm* — IPUSA, PLLC

(57)                    ABSTRACT
An interconnect substrate includes an insulating layer, a dispersion layer, and an interconnect layer, the insulating layer, the dispersion layer, and the interconnect layer being laminated together, wherein the dispersion layer includes a main material and one or more fillers dispersed in the main material, the one or more fillers forming a unique dispersion pattern, and wherein the unique dispersion pattern is identifiable by image recognition from outside of the interconnect substrate.

10 Claims, 9 Drawing Sheets

1

(56)                    References Cited

U.S. PATENT DOCUMENTS

| | | | |
|---|---|---|---|
| 2020/0018944 A1* | 1/2020 | Fang | G06N 20/00 |
| 2022/0104352 A1* | 3/2022 | Yukiiri | H05K 3/4673 |
| 2023/0207330 A1* | 6/2023 | Mukesh | H10P 50/71 |
| | | | 257/774 |
| 2023/0351577 A1* | 11/2023 | Chen | G06T 7/0004 |

* cited by examiner

1A

S101
IMAGE REFERENCE IMAGE

S102
SEPARATE SUBSTRATE
(CUTTING)

S103
SHIP SUBSTRATE

S201
IMAGE INSPECTION IMAGE

S202
BINARIZE REFERENCE IMAGE
AND INSPECTION IMAGE

S203
COLLATE INSPECTION IMAGE
WITH REFERENCE IMAGE

S204
DETERMINE MATCHING

INTERCONNECT SUBSTRATE, METHOD OF MAKING THE SAME, AND METHOD OF IDENTIFYING INTERCONNECT SUBSTRATE

CROSS-REFERENCE TO RELATED APPLICATIONS

The present application is based on and claims priority to Japanese Patent Application No. 2022-106602 filed on Jun. 30, 2022, with the Japanese Patent Office, the entire contents of which are incorporated herein by reference.

FIELD

The disclosures herein relate to interconnect substrates, methods of making an interconnect substrate, and methods of identifying an interconnect substrate.

BACKGROUND

In an interconnect substrate, identification marks may be formed. For example, in an interconnect substrate to be separated into a plurality of pieces, marks are formed on an insulator at the boundary of each piece so that the marks are partially exposed from the side surface of the piece. By viewing the side surfaces of the pieces after the separation, the positional information of the piece in the interconnect substrate can be determined from differences in the number of marks and embedded positions (see Patent Document 1, for example).

However, in the interconnect substrate described in Patent Document 1, since it is necessary to accurately embed the marks at predetermined positions, the individual piece needs to have a certain size, and spaces for embedding the marks are also required. This tends to lead to an increase in the size of the interconnect substrate.

Accordingly, there may be a need to provide a small sized interconnect substrate having identification information.

RELATED-ART DOCUMENTS

Patent Document

[Patent Document 1] Japanese Patent Application Laid-Open No. 2012-39028

SUMMARY

According to an aspect of the embodiment, an interconnect substrate includes an insulating layer, a dispersion layer, and an interconnect layer, the insulating layer, the dispersion layer, and the interconnect layer being laminated together, wherein the dispersion layer includes a main material and one or more fillers dispersed in the main material, the one or more fillers forming a unique dispersion pattern, and wherein the unique dispersion pattern is identifiable by image recognition from outside of the interconnect substrate.

DESCRIPTION OF EMBODIMENT

Figure 1:
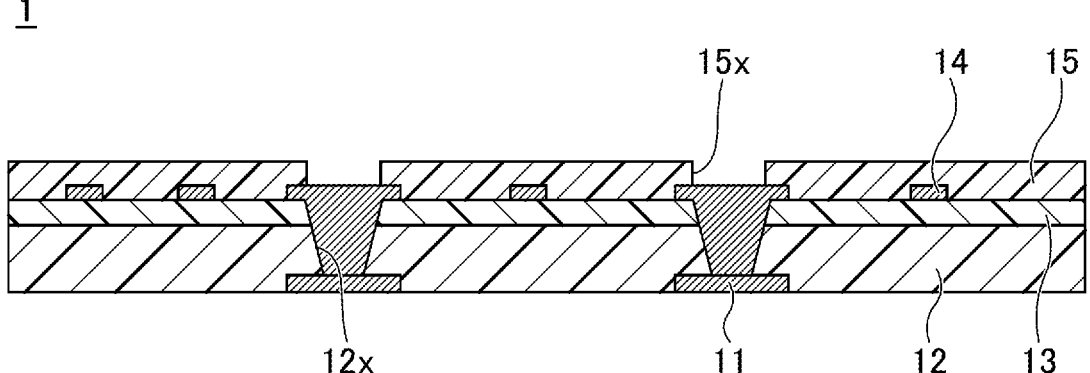
FIG. 1 is a cross-sectional view illustrating an example of an interconnect substrate according to an embodiment.

In the following, an embodiment will be described by referring to the accompanying drawings. In these drawings, the same elements are referred to by the same references, and a duplicate description thereof may be omitted.
[Structure of Interconnect Substrate]
FIG. 1 is a cross-sectional view illustrating an example of an interconnect substrate according to the present embodiment. Referring to FIG. 1, an interconnect substrate 1 according to the present embodiment is a coreless interconnect substrate including an interconnect layer 11, an insulating layer 12, a dispersion layer 13, an interconnect layer 14, and a solder resist layer 15. The solder resist layer 15 is provided as necessary.

In the present embodiment, for the sake of convenience, the side of the interconnect substrate 1 on which the solder resist layer 15 is situated is referred to as an upper side, and the side on which the insulating layer 12 is situated is referred to as a lower side. A surface of a given member that faces toward the solder resist layer 15 is referred to as an upper surface, and a surface of the given member that faces toward the insulating layer 12 is referred to as a lower surface. It may be noted, however, that the interconnect substrate 1 may be used in an upside-down position, or may be placed at any angle. Further, a plan view refers to a view taken in the direction perpendicular to the upper surface of the solder resist layer 15, and a plane shape refers to the shape of an object as viewed in the direction perpendicular to the upper surface of the solder resist layer 15.

In the interconnect substrate 1, the interconnect layer 11 is the lowermost interconnect layer. For example, copper or the like may be used as the material of the interconnect layer 11. A laminate film including a copper layer, a gold layer, or the like may be used as the interconnect layer 11. The thickness of the interconnect layer 11 may be, for example, about 10 μm to 20 μm. The lower surface of the interconnect layer 11 is exposed from the insulating layer 12. The interconnect layer 11 can be used as, for example, a pad that is electrically connected to another interconnect substrate or the like. The interconnect layer 11 may include interconnect patterns in addition to the pad.

The insulating layer 12 is formed to cover the upper surface and the side surface of the interconnect layer 11 and expose the lower surface thereof. As the material of the insulating layer 12, for example, a thermosetting insulating resin containing an epoxy-based resin or a polyimide-based resin as a main component can be used. The insulating resin used as the material of the insulating layer 12 may be photosensitive or non-photosensitive. The insulating layer 12 may contain one or more fillers such as silica (SiO₂).

The dispersion layer 13 is an insulating layer laminated on the insulating layer 12. The dispersion layer 13 will be described later.

The insulating layer 12 and the dispersion layer 13 are provided with via holes 12x that continuously extend through the insulating layer 12 and the dispersion layer 13 and expose the upper surface of the interconnect layer 11. The shape of the via holes 12x may be a frustum of an inverted right circular cone for which the diameter of an opening of the hole toward the solder resist layer 15 is greater than the diameter of the bottom surface of the opening of the hole at the upper surface of the interconnect layer 11.

The interconnect layer 14 fills the via holes 12x, is electrically connected to the interconnect layer 11, and extends from the inside of the via hole 12x to the upper surface of the dispersion layer 13. Specifically, the interconnect layer 14 includes via interconnects that fill the via holes and interconnect patterns formed on the upper surface of the dispersion layer 13. The interconnect patterns of the interconnect layer 14 are electrically connected to the interconnect layer 11 through the via interconnects in the via holes 12x. The material and the thickness of the interconnect patterns of the interconnect layer 14 are, for example, the same as those of the interconnect layer 11.

The solder resist layer 15 is an insulating layer located at the outermost layer on one side of the interconnect substrate 1, and is formed on the upper surface of the dispersion layer 13 so as to cover the interconnect layer 14. The solder resist layer 15 can be formed of, for example, a photosensitive resin such as an epoxy resin or an acrylic resin. The thickness of the solder resist layer 15 may be, for example, about 15 μm to 35 μm.

The solder resist layer 15 has openings 15x to partially expose the upper surface of the interconnect layer 14 at the bottom of the opening 15x. The plane shape of the opening 15x may be, for example, a circle. If necessary, a metallic layer may be formed on the upper surface of the interconnect layer 14 exposed in the opening 15x, or an anti-oxidation treatment such as OSP (Organic Solderability Preservative) treatment may be applied. Examples of the metal layer include an Au layer, an Ni/Au layer (i.e., a metal layer in which an Ni layer and an Au layer are laminated in this order), and an Ni/Pd/Au layer (i.e., a metal layer in which an Ni layer, a Pd layer, and an Au layer are laminated in this order), and the like. The interconnect layer 14 exposed in the opening 15x can be used as, for example, external connection terminals for electrical connection with a semiconductor chip.

[Dispersion Layer]

The dispersion layer 13 is a layer having identification information for identifying the interconnect substrate 1, and includes a main material such as a resin and one or more fillers dispersed in the main material. The one or more fillers form a unique dispersion pattern, and the pattern is identifiable by image recognition from the outside of the interconnect substrate. For example, before shipment of the interconnect substrate, an image of the dispersion pattern is captured from the outside of the interconnect substrate, and the captured image is recorded as a reference image in association with manufacturing information about the interconnect substrate. Thus, for example, in a case of the interconnect substrate being returned as a defective product after shipment, an image of the dispersion pattern is captured from the outside of the interconnect substrate as an inspection image. The inspection image and the reference image are compared with each other, whereby the manufacturing information can be known. The manufacturing information is, for example, a manufacturing date, a manufacturing place, positional information of the interconnect substrate before being separated into pieces, or the like.

As a main material of the dispersion layer 13, any material usually used for an interconnect substrate can be selected from a thermosetting resin such as an epoxy-based resin or a phenol-based resin, a thermoplastic resin such as a polyimide-based resin or an acrylic-based resin, various elastomers, precursors thereof, copolymers thereof, and the like. The main material of the dispersion layer 13 may be the same as or different from the material of the insulating layer 12. Note that, by using an amorphous thermoplastic resin or a crystalline thermoplastic resin having an amorphous portion, the transparency of the dispersion layer 13 is improved, and detection of the one or more fillers using an optical method becomes easy.

In the dispersion layer 13, for example, particles, fibers, or the like can be used as the filler. The particles or fibers may be granular, needle-like, angular, plate-like, or the like, and may or may not be flexible. The one or more fillers are preferably non-conductive. Specifically, as the filler, an inorganic oxide, an inorganic nitride, or an organic substance in the form of particles or fibers can be used. Examples of the inorganic oxide include SiO₂, Al₂O₃, and the like. Examples of the inorganic nitride include BN, AlN, and the like. Examples of the organic substance include polyimide, phenol, rubber, cellulose, and the like. In addition to these, as the organic substance, calcium compounds, potassium compounds, and the like can also be used. The filler may be colored by kneading, coating, or the like with a dye, a pigment, or the like.

Figure 2C:
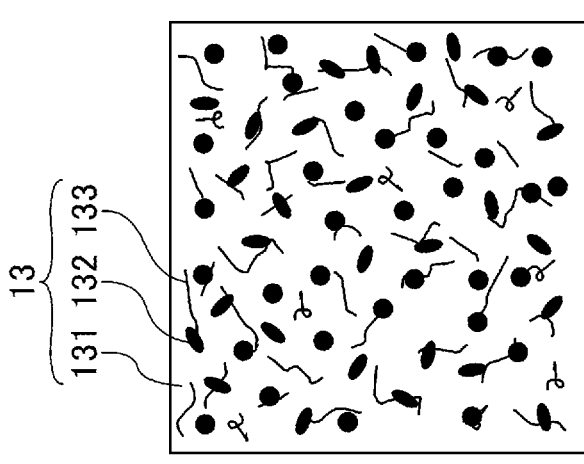
FIGS. 2A through 2C are schematic plane views illustrating examples of a dispersion layer.
Figure 2B:
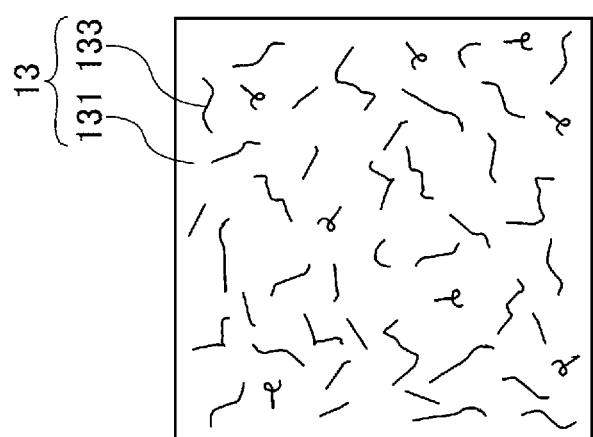
Figure 2A:
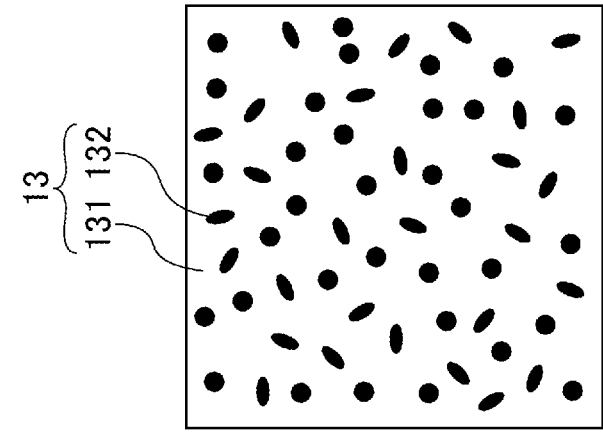

FIG. 2 are schematic plan views illustrating dispersion layers. FIG. 2A shows an example in which particles 132 are dispersed in a main material 131. The particles 132 may be of one kind, but in order to improve the identifiability of the interconnect substrate 1, for example, two or more kinds of particles having different particle diameters may be mixed. Further, when the size and shape of the particles 132 are not uniform, the identifiability of the interconnect substrate 1 can be improved.

FIG. 2B shows an example in which fibers 133 are dispersed in the main material 131. When the size and shape of the fibers 133 are not uniform, the identifiability of the interconnect substrate 1 can be improved. As illustrated in FIG. 2C, the particles 132 and the fibers 133 may be dispersed in the main material 131. This makes it difficult for a plurality of interconnect substrates to have similar dispersion patterns, thereby further improving the identifiability of the interconnect substrate 1.

In addition, in order to improve the identifiability of the interconnect substrate 1, it is preferable that the density of one or more fillers is non-uniform in a plan view. Here, the non-uniform density of one or more fillers means that when the dispersion layer is divided into sections of 5 rows and 5 columns having the same area in a plan view, the density of the one or more fillers in each section and the average value of the density of the one or more fillers in each section are calculated, and the maximum value and the minimum value of the density of the one or more fillers in each section with respect to the average value exceed ±30%. The density of the one or more fillers in each section can be determined by magnifying the image of the dispersion layer and calculating the area of the one or more fillers in each section relative to the area of each section.

In a plan view, for example, the density of the particles 132 and the fibers 133 may decrease from the predetermined side toward the opposite side. In this case, the density of the particles 132 and the fibers 133 may decrease stepwise or continuously from a predetermined side toward the opposite side.

Figure 3C:
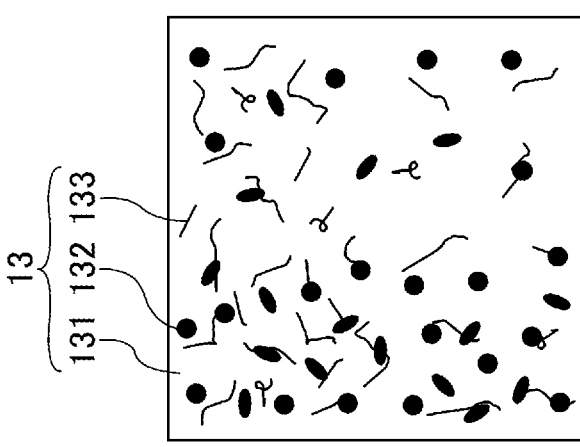
FIGS. 3A through 3C are schematic plane views explaining examples in which filler density is changed in the dispersion layer.
Figure 3B:
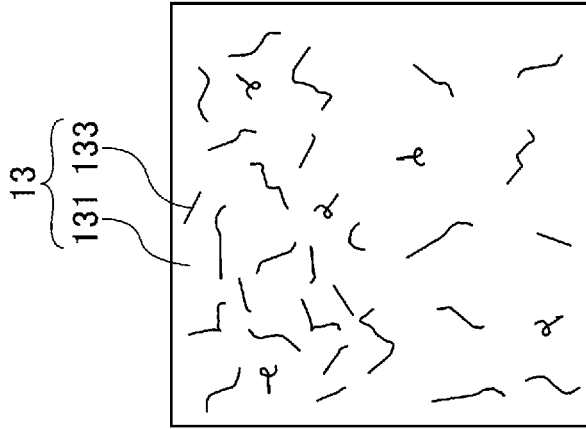
Figure 3A:
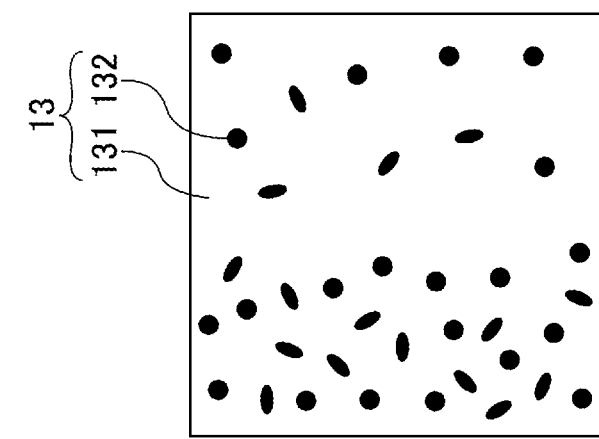

FIG. 3A shows an example in which the density of the particles 132 is changed in the dispersion layer 13. In FIG. 3A, the particles 132 are arranged at a high density on the left side from the center and the particles 132 are arranged at a low density on the right side from the center. That is, in FIG. 3A, the density of the particles 132 decreases stepwise from the left side to the right side. The density may be changed in three or more steps.

FIG. 3B shows an example in which the density of the fibers 133 is changed in the dispersion layer 13. In FIG. 3B, the fibers 133 are arranged at a high density above from the center and the fibers 133 are arranged at a low density below from the center. That is, in FIG. 3B, the density of the fibers 133 decreases stepwise from the upper side to the lower side. The density may be changed in three or more steps.

FIG. 3C shows an example in which the density of the particles 132 and the density of the fibers 133 are changed in the dispersion layer 13. In FIG. 3C, the particles 132 are arranged at a high density on the left side from the center and the particles 132 are arranged at a low density on the right side from the center. Further, the fibers 133 are arranged at a high density above from the center, and the fibers 133 are arranged at a low density below from the center. That is, in FIG. 3C, the density of the particles 132 decreases stepwise from the left side to the right side, and the density of the fibers 133 decreases stepwise from the upper side to the lower side. The density may be changed in three or more steps.

In this way, by making the density of one or more fillers non-uniform by a method such as decreasing the density of the particles 132 and the fibers 133 in one direction in the dispersion layer 13, the identification accuracy of the position of each piece in the interconnect substrate 1 can be improved.

Although particles of the filler or the like may be dispersed in a normal insulating layer, the particles of the filler or the like are dispersed for improving physical properties (for example, a thermal expansion coefficient) of the insulating layer, and thus particles having substantially the same size and shape are uniformly dispersed in the entire insulating layer. When one or more fillers are uniformly dispersed in the dispersion layer, the number of similar reference images increases and the identifiability decreases. Therefore, the one or more fillers dispersed in the dispersion layer are preferably non-uniform as compared with the particles or the like dispersed in the insulating layer.

Figure 4:
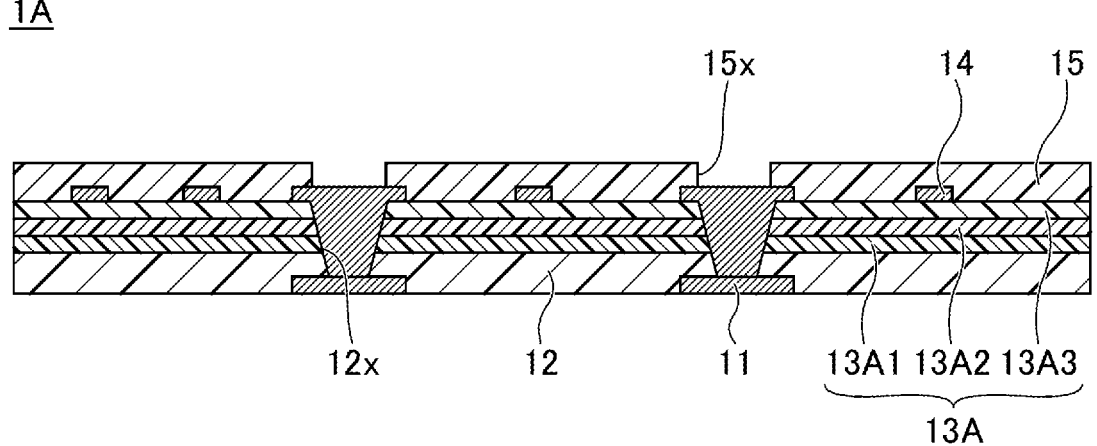
FIG. 4 is a cross-sectional view explaining an example in which the dispersion layer has a multilayer structure.
Figure 5A:
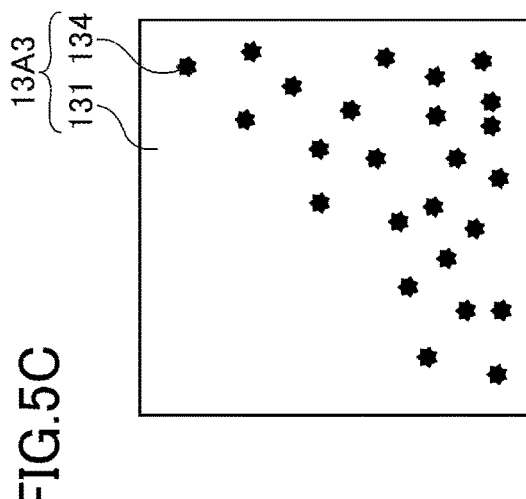
FIGS. 5A through 5D are schematic plane views explaining examples in which the dispersion layer has the multilayer structure.
Figure 5B:
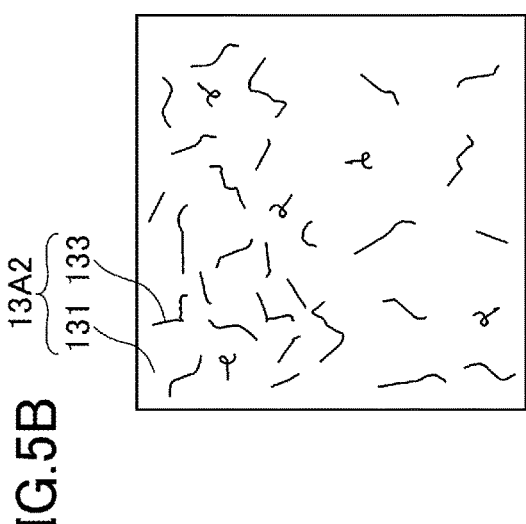
Figure 5C:
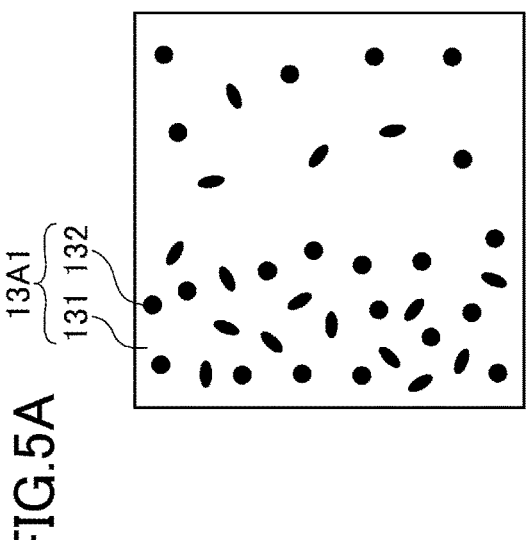
Figure 5D:
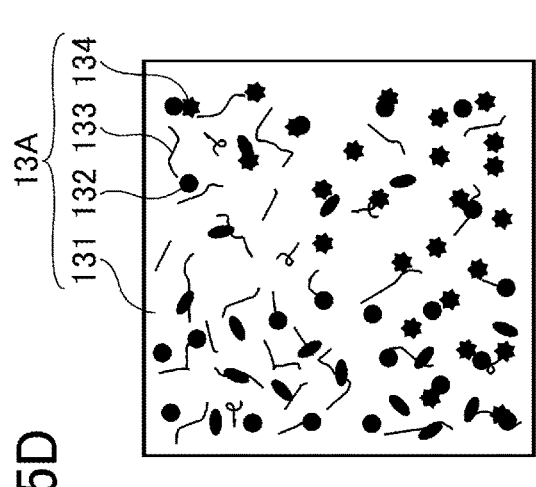

As in the interconnect substrate 1A illustrated in FIG. 4, the dispersion layer may have a multilayer structure. In the interconnect substrate 1A, a dispersion layer 13A has a multilayer structure of a first layer 13A1, a second layer 13A2, and a third layer 13A3. As illustrated in FIG. 5A, the first layer 13A1 is a layer in which the particles 132 are dispersed in the main material 131. As illustrated in FIG. 5B, the second layer 13A2 is a layer in which the fibers 133 are dispersed in the main material 131. As illustrated in FIG. 5C, the third layer 13A3 is a layer in which particles 134 having a shape different from that of the particles 132 are dispersed in the main material 131. When the dispersion layer 13A is viewed in a plan view, as illustrated in FIG. 5D, the particles 132, the fibers 133, and the particles 134 are visually identifiable in a mixed state in the main material 131, and thus the identifiability of the interconnect substrate 1 can be improved. The multilayer structure of the dispersion layer is not limited to three layers and may be two layers or four or more layers.

Figure 6:
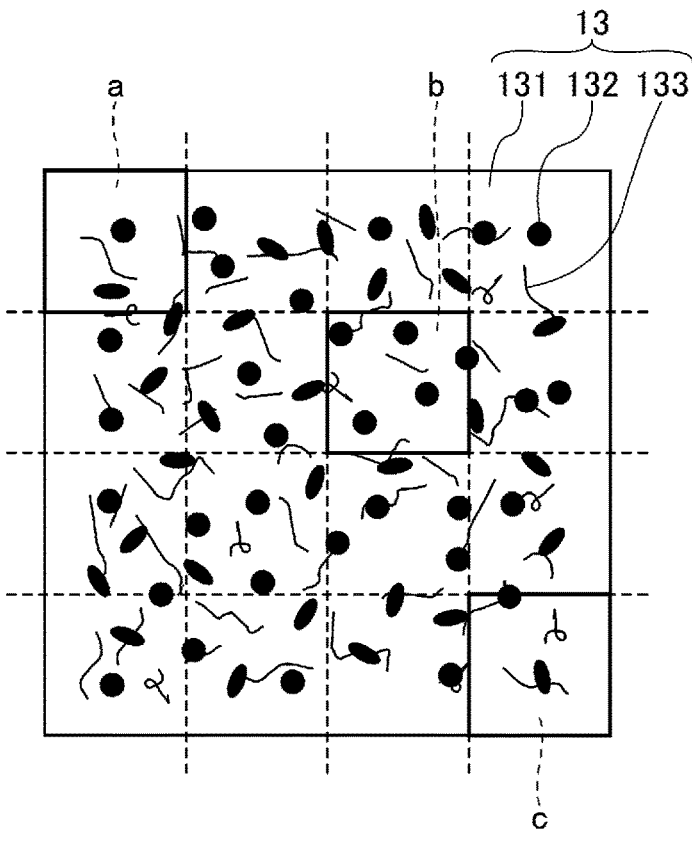
FIG. 6 is a schematic plane view explaining an example of the interconnect substrate to be separated into a plurality of pieces.

The interconnect substrate 1 may be a single interconnect substrate, or may be an interconnect substrate to be separated into a plurality of pieces. FIG. 6 shows an example of a dispersion layer of an interconnect substrate to be separated into 16 pieces. In FIG. 6, vertical and horizontal broken lines indicate cutting lines for separation. Normally, since the interconnect patterns or the like of each interconnect substrate after separation are common, the positional information of each piece of the interconnect substrate cannot be known by visual observation or the like, but tracing can be performed by identifying the patterns of one or more fillers in the dispersion layer 13. For example, in the dispersion layer 13 of FIG. 6, regions a, b, and c can be identified, since the pattern formed by the fillers including the particles 132 and the fibers 133 in each region is different from each other.

[Method of Making Interconnect Substrate]

Figure 7A:
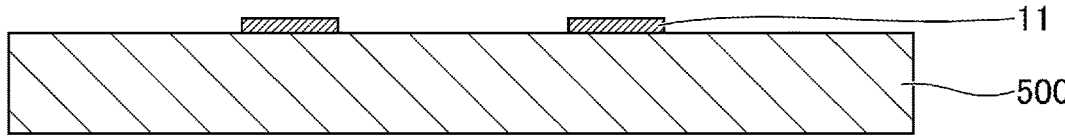
FIGS. 7A through 7E are drawings illustrating an example of steps of making the interconnect substrate according to the embodiment.
Figure 7B:
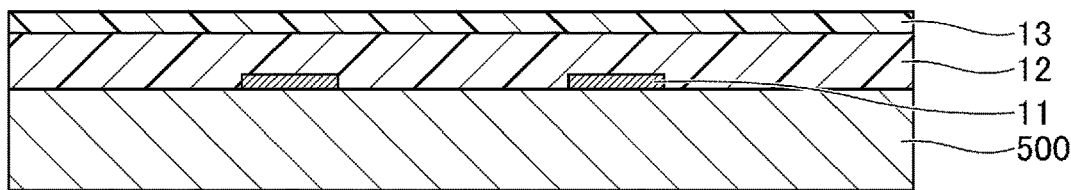
Figure 7C:
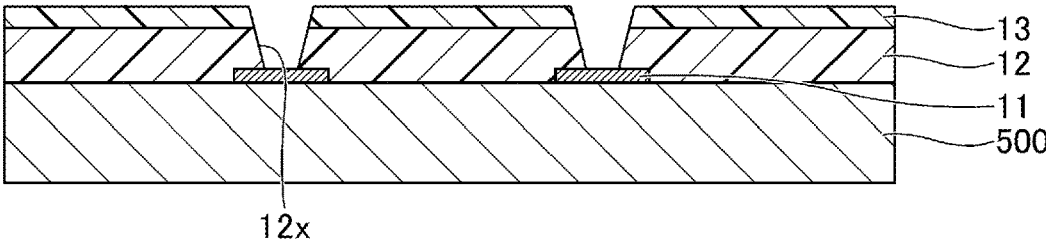
Figure 7D:
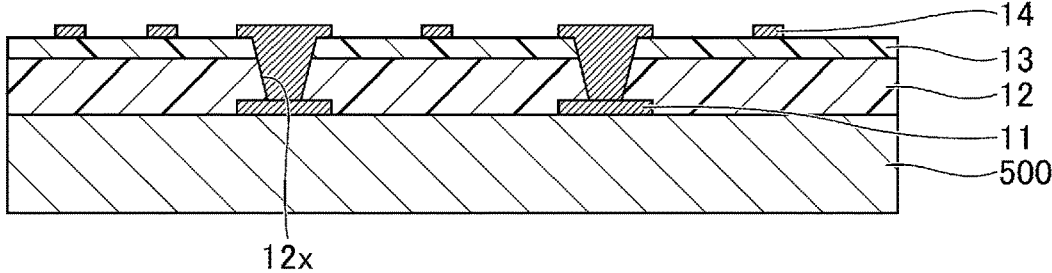
Figure 7E:
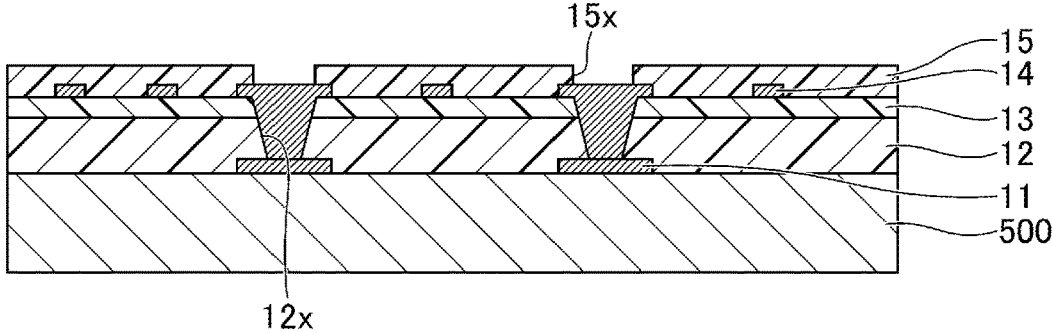
Figure 8:
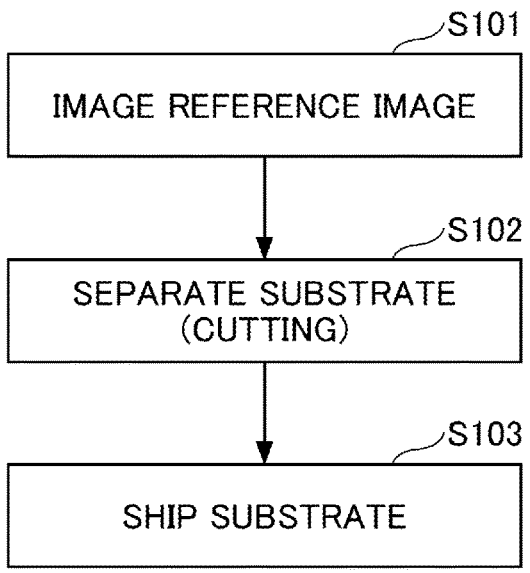
FIG. 8 is a drawing illustrating an example of steps of making the interconnect substrate according to the embodiment.

FIGS. 7 and 8 are drawings illustrating the process of making the interconnect substrate of the present embodiment.

In the step illustrated in FIG. 7A, a support member 500 is put in place, and an interconnect layer 11 is formed on the upper surface of the support member 500. As the support member 500, a resin plate, a metal plate, a silicon plate, a glass plate, or the like can be used. The interconnect layer 11 may be formed by, for example, disposing a copper foil on the upper surface of the support member 500, further disposing an etching mask having a predetermined shape on the copper foil, and etching the copper foil. When the support member 500 is a metal plate, the interconnect layer 11 may be formed by performing electrolytic plating using the metal plate as a power feed layer.

In the step illustrated in FIG. 7B, an insulating layer 12 and a dispersion layer 13 are sequentially laminated on the upper surface of the support member 500 to cover the interconnect layer 11. Specifically, for example, an insulating resin having a film type thermosetting epoxy resin as a main component is prepared as the insulating layer 12, and is laminated on the upper surface of the support member 500 to cover the interconnect layer 11. Then, as the dispersion layer 13, for example, an insulating resin having a main material of a film type thermosetting epoxy resin and one or more fillers dispersed in the main material is prepared. The one or more fillers are either particles, fibers or both. The insulating resin is then laminated on the upper surface of the insulating layer 12. Thereafter, while pressing the laminated insulating layer 12, the insulating layer 12 is heated and cured at a curing temperature or higher.

Alternatively, as the material of the insulating layer 12, for example, an insulating resin having a main material of a liquid type or paste type thermosetting epoxy resin is prepared. The insulating resin is then applied to the upper surface of the support member 500 by a spin coating method or the like to cover the interconnect layer 11, and cured. Similarly, as the material of the dispersion layer 13, an insulating resin having a main material of a liquid type or paste type thermosetting epoxy resin and one or more fillers dispersed in the main material is prepared. The one or more fillers are either particles, fibers, or both. The insulating resin is then applied to the upper surface of the insulating layer 12 by a spin coating method or the like, and cured.

In the step illustrated in FIG. 7C, via holes 12x extending through the insulating layer 12 and the dispersion layer 13 to expose the upper surface of the interconnect layer 11 are formed in the insulating layer 12 and the dispersion layer 13. The via hole 12x can be formed by, for example, a laser processing method using a $CO_2$ laser or the like. The shape of the via hole 12x formed by the laser processing method is a frustum of an inverted right circular cone for which the diameter of an opening of the hole toward the interconnect layer 14 is greater than the diameter of the bottom surface of the opening of the hole at the upper surface of the interconnect layer 11. When the via hole 12x is formed by the laser processing method, it is preferable to perform a desmear process to remove the residual resin of the insulating layer 12 adhering to the upper surface of the interconnect layer 11 exposed at the bottom of the via hole 12x. A photosensitive resin may be used for the insulating layer 12 and the dispersion layer 13, and the via hole 12x may be formed by a photolithography method.

In the step illustrated in FIG. 7D, the interconnect layer 14 is formed on the dispersion layer 13. The interconnect layer 14 can be formed using various interconnect forming methods such as a semi-additive method and a subtractive method. For example, when the interconnection layer 14 is formed by the semi-additive method, a seed layer is formed by an electroless plating method or a sputtering method on the upper surface of the interconnection layer 11 exposed at the bottom of the via holes 12x and the dispersion layer 13 including the inner surface of the via holes 12x. A resist layer having openings corresponding to the interconnect layer 14 is then formed on the seed layer. Electrolytic plating is performed by using the seed layer as a power feed layer to form an electroplating layer on the openings of the resist layer. After detaching the resist layer, the electroplating layer is used as a mask to etch and remove the seed layer at the places not covered with the electroplating layer. With this arrangement, the interconnect layer 14 including the seed layer and the electroplating layer laminated thereon is formed.

In the step illustrated in FIG. 7E, a solder resist layer 15 that covers the interconnect layer 14 is formed on the upper surface of the dispersion layer 13. The solder resist layer 15 can be formed by, for example, applying a liquid type or paste type insulating resin to cover the interconnect layer 14 by a screen-printing method, a roll coating method, a spin coating method, or the like. Alternatively, a film type insulating resin may be laminated to cover the interconnect layer 14. As the insulating resin, for example, a photosensitive epoxy insulating resin, an acrylic insulating resin, or the like can be used. The applied or laminated insulating resin is then exposed and developed to form openings 15x that selectively expose the interconnect layer 14 in the solder resist layer 15 (photolithography).

If necessary, a metallic layer may be formed on the upper surface of the interconnect layer 14 exposed in the openings 15x by, for example, an electroless plating method or the like. Examples of the metal layer are as described above. The upper surface of the interconnection layer 14 exposed in the openings 15x may be subjected to an anti-oxidation treatment such as OSP treatment. Through the above steps, the shape of the interconnect substrate 1 is formed.

In Step S101 of FIG. 8, an image of the dispersion pattern is captured from the outside of the interconnect substrate 1 (for example, from above the solder resist layer 15), and the captured image is recorded as a reference image in association with manufacturing information about the interconnect substrate 1. In the reference image, as long as the dispersion pattern of the one or more fillers in the dispersion layer 13 is captured, the entire interconnect substrate 1 may be captured or a part thereof may be captured. Capturing is performed by, for example, an optical method using visible light or the like, a method using electromagnetic waves such as X-rays, or the like. Since it is only required to identify the interconnect substrate, other information (for example, interconnect patterns or the like) may be captured in addition to the dispersion pattern. The particles or fibers may not be clearly captured when the solder resist layer 15 is photographed from above, if the color of the solder resist layer 15 is dark. In that case, an inspection image may be processed by image processing software or the like. Similarly, the reference image may be processed by image processing software or the like.

In Step S102, the interconnect substrate 1 is separated (cutting) into pieces. For example, the structure illustrated in FIG. 7E is cut at predetermined cutting positions by a slicer or the like to separate into pieces. In the case of a single interconnect substrate that does not need to be separated, Step S102 is skipped. In Step S103, the interconnect substrate 1 is shipped. Noted that a product inspection or the like of the interconnect substrate 1 may be performed as necessary between Step S101 to Step S103. The order of Step S101 and Step S102 may be changed. That is, in the case of an interconnect substrate that needs to be separated into pieces, the reference image may be captured after separation. Also, at this time, the reference image is recorded in association with the positional information of the interconnect substrate before separation.

[Method for Identifying Interconnect Substrate]

Figure 9:
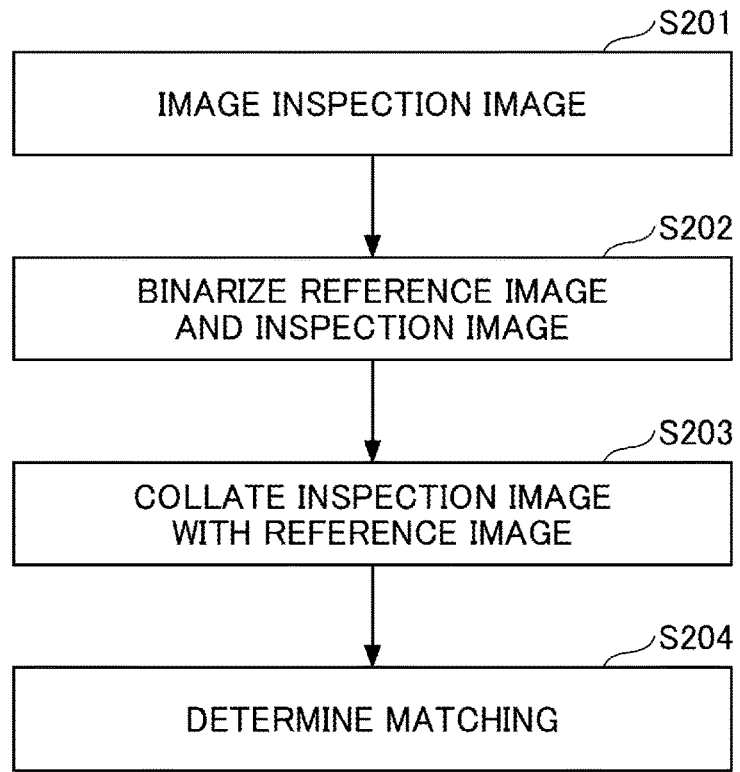
FIG. 9 is a drawing illustrating a method of identifying the interconnect substrate using the dispersion layer.

Hereinafter, an example of a method of identifying an interconnect substrate using a dispersion layer will be described. FIG. 9 is a drawing illustrating the method of identifying an interconnect substrate using a dispersion layer. A description will be given of a case where the interconnection substrate 1 shipped in Step S103 of FIG. 8 is returned. The place to which the interconnect substrate 1 is returned may be a factory or the like that has shipped the interconnect substrate 1, however, it may be a place other than the factory or the like that has shipped the interconnect substrate 1 if the place is a place where an imaging device of the same type as the imaging device that has captured the reference image is installed.

In Step S201, an inspection image of the dispersion pattern is captured from the outside of the returned interconnect substrate 1 (for example, from above the solder resist layer 15). In order to improve the identifiability of the interconnect substrate 1, it is preferable that the conditions for capturing the inspection image are the same as the conditions for capturing the reference image. When there is an object such as a heat spreader or an underfill resin applied to the interconnect substrate 1 after the shipment of the interconnect substrate 1, the inspection image is captured after the applied object is removed as necessary.

In Step S202, the reference image and the inspection image are binarized. By binarizing the reference image and the inspection image, the matching accuracy between the reference image and the inspection image may be improved. In some cases, the difference in color or brightness between the main material and the particles of the dispersion layer is small, and it is difficult to compare the binarized inspection image with the binarized reference image. In this case, Step S202 may be skipped, and the reference image and the inspection image may be compared with each other without performing the binarization processing. In other words, Step S202 is executed as necessary. Instead of binarization, gray scale processing, contrast adjustment processing, or the like may be applied.

In Step S203, the binarized inspection image is compared with the image in the database of the reference image. For example, the dispersion pattern of the inspection image is compared with the dispersion pattern of the reference image stored in the database while rotating or adjusting the position of the inspection image. When Step S202 is skipped, the raw image of the inspection image is compared with the images in the database of the reference image. When the inspection image and the reference image are compared with each other, an interconnect, a pad, or the like in the interconnect substrate may be used as a mark to make a positional match.

In Step S204, it is determined whether the reference image and the inspection image match. Specifically, for example, a degree of match between the reference image and the inspection image with respect to one or more specific features is calculated, and when the degree of match is greater than or equal to a predetermined threshold value, it is determined that the reference image and the inspection image match. The manufacturing information about the interconnect substrate 1 is then specified. The degree of match may be calculated for the entire dispersion layer or for a part of the dispersion layer. Note that, in a case where the degree of match is calculated for a part of the dispersion layer, if the degree of match is calculated for only one place of the dispersion layer, a plurality of reference image candidates may appear. Therefore, the degree of match is preferably calculated for two or more places of the dispersion layer.

Any method may be used for calculating the degree of match. For example, focusing on a specific particle type, the centers of the particles of that type are sequentially connected by a straight line to form a figure for both the reference image and the inspection image. Then, the areas of the figures can be compared. As another example, in the inspection image illustrated in FIG. 10, six particles are selected, and the area of a hexagon formed by connecting the centers of the respective particles by a straight line is calculated. The reference image in which particles are present at approximately similar positions as those in the inspection image is then extracted from the reference image database. In the reference image, the area of a hexagon formed in the same manner as for the inspection image is calculated. If the area of the hexagon of the reference image is within ±10% of the area of the hexagon of the inspection image, it is determined that both images match. If a plurality of candidates is extracted from the database, the reference image having the area of the hexagon closest to that of the inspection image is selected.

Figure 10:
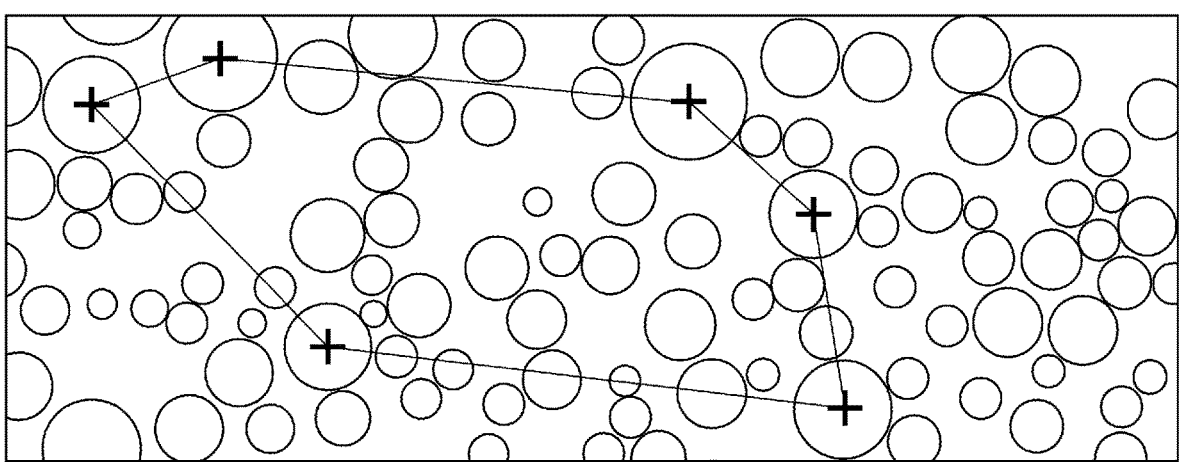
FIG. 10 is a drawing explaining a method of calculating a degree of match.

Further, in FIG. 10, focusing on the position, the area, and the circularity of each of the selected six particles, match between the inspection image and the reference image may be determined based on the degree of match for the position, the degree of match for the area, and the degree of match for the circularity. At this time, the match may also be determined in combination with the result of the areas comparison described above. Furthermore, for the identification of the interconnect substrate, the information of the dispersion pattern of the dispersion layer may be used in combination with the information of another identifier such as a fiducial mark or an engraved mark.

In this way, in the interconnect substrate in which the insulating layer, the dispersion layer, and the interconnect layer are laminated, by comparing the dispersion patterns of the dispersion layer of the reference image and the inspection image using an image analysis software or the like, it is possible to identify the interconnect substrate and to associate a specific interconnect substrate with the manufacturing information. That is, traceability of the interconnect substrate can be improved.

Since the dispersion layer does not require an additional space in the planar direction as in Patent Document 1, it is also possible to realize a small sized interconnect substrate provided with identification information. Further, since the dispersion layer may be thinner than the insulating layer, the dispersion layer is less likely to interfere with the thinning of the interconnect substrate.

Furthermore, by using a material generally used in an interconnect substrate, such as silica or cellulose, for forming the dispersion pattern of the dispersion layer, there is no adverse effect on the making of the interconnect substrate or the characteristics of the interconnect substrate. When only the dispersion pattern is used for identification of the interconnect substrate and the marking of the serial number or the like is not performed, it is also possible to realize suppression of dust generation in marking, reduction of a space for marking, and the like.

Although a preferred embodiment has been described in detail above, the present disclosure is not limited to the above-described embodiment, and various modifications and substitutions can be added thereto without departing from the scope and sprit of the present disclosure.

For example, the coreless interconnect substrate is described in the above embodiment, however, the present disclosure is applicable to various interconnect substrates including an interconnect substrate having a core substrate.

In addition, the dispersion layer may be laminated at any position if the interconnect substrate is formed by laminating the insulating layer, the dispersion layer, and the interconnect layer. For example, the dispersion layer may be disposed in the lowermost layer or the uppermost layer of the interconnect substrate. Also, a filler may be added to the uppermost solder resist layer to function as a dispersion layer. The interconnect substrate may also have more interconnect layers and insulating layers than the interconnect substrate in the example illustrated in FIG. 1.

According to the embodiment, a small sized interconnect substrate having identification information is provided.

[Clause 1] A method of making an interconnect substrate in which an insulating layer, a dispersion layer, and an interconnect layer are laminated, wherein the dispersion layer includes a main material and one or more fillers dispersed in the main material, the one or more fillers forming a unique dispersion pattern, the method including capturing an image of the dispersion pattern from outside of the interconnect substrate and recording the captured image as the reference image in association with manufacturing information about the interconnect substrate.

[Clause 2] The method of making an interconnect substrate according to clause 1, wherein the one or more fillers are either non-conductive particles, fibers, or both.

[Clause 3] The method of making an interconnect substrate according to clause 1 or 2, wherein density of one or more fillers is non-uniform in a plan view.

The invention claimed is:

1. An interconnect substrate comprising:
an insulating layer;
a dispersion layer; and an interconnect layer, the insulating layer, the dispersion layer, and the interconnect layer being laminated together, wherein the dispersion layer includes a main material and one or more fillers dispersed in the main material, the one or more fillers forming a unique dispersion pattern, and wherein the unique dispersion pattern is identifiable by image recognition from outside of the interconnect substrate.

2. The interconnect substrate as claimed in claim 1, wherein the one or more fillers are either non-conductive particles, fibers, or both.

3. The interconnect substrate as claimed in claim 2, wherein the dispersion layer includes a plurality of layers, and each of the plurality of layers contains a filler of a different type or shape than a filler contained in one or more other layers of the plurality of layers.

4. The interconnect substrate as claimed in claim 1, wherein density of the one or more fillers is non-uniform in a plan view.

5. The interconnect substrate as claimed in claim 4, wherein when the dispersion layer is divided into sections of 5 rows and 5 columns having a same area in a plan view, and a section-wise density of the one or more fillers in each section and an average value of section-wise densities of the one or more fillers in all of the sections are calculated, a maximum value and a minimum value of the section-wise densities are outside a range of 30% above and below the average value in at least one of the sections.

6. The interconnect substrate as claimed in claim 4, wherein the density of the one or more fillers decreases from one side to an opposite side in a predetermined direction in a plan view of the dispersion layer.

7. The interconnect substrate as claimed in claim 1, wherein the main material of the dispersion layer is a material selected from a group consisting of a thermosetting resin including an epoxy-based resin or a phenol-based resin, a thermoplastic resin including a polyimide-based resin or an acrylic-based resin, an elastomer, a precursor thereof, and a copolymer thereof.

8. The interconnect substrate as claimed in claim 1, wherein the main material of the dispersion layer is an amorphous thermoplastic resin or a crystalline thermoplastic resin having an amorphous portion.

9. The interconnect substrate as claimed in claim 1, wherein the one or more fillers are an inorganic oxide or an inorganic nitride.

10. The interconnect substrate as claimed in claim 1, wherein the one or more fillers are an organic substance.

*    *    *    *    *